United States Patent [19]
Leigh et al.

[11] Patent Number: 5,764,489
[45] Date of Patent: Jun. 9, 1998

[54] APPARATUS FOR CONTROLLING THE IMPEDANCE OF HIGH SPEED SIGNALS ON A PRINTED CIRCUIT BOARD

[75] Inventors: Kevin B. Leigh; Michael Y. Chan, both of Houston, Tex.

[73] Assignee: Compaq Computer Corporation, Houston, Tex.

[21] Appl. No.: 685,181

[22] Filed: Jul. 18, 1996

[51] Int. Cl.⁶ .................................................. H05K 7/02
[52] U.S. Cl. ........................ 361/777; 361/783; 174/261
[58] Field of Search ............................ 361/777, 778, 361/780, 783, 794, 826, 782, 749–751; 257/700, 723, 724, 786; 333/1, 12, 32–34; 439/941, 947; 174/117 F, 117 FF, 254, 268, 72 A, 261

[56] References Cited

U.S. PATENT DOCUMENTS

| | | | |
|---|---|---|---|
| 4,798,918 | 1/1989 | Kabadi et al. | 333/1 |
| 4,825,155 | 4/1989 | Takamine | 333/12 |
| 5,682,124 | 10/1997 | Suski | 333/1 |
| 5,699,231 | 12/1997 | ElHatem et al. | 174/261 |

FOREIGN PATENT DOCUMENTS 1 570 165   6/1980   United Kingdom ............... 361/796

*Primary Examiner*—Leo P. Picard
*Assistant Examiner*—John B. Vigushin
*Attorney, Agent, or Firm*—Jenkens & Gilchrist

[57] ABSTRACT

The present invention relates to the placement of signal traces on a two-sided printed circuit board such that impedance of the traces is controlled and so that the number of power and ground pins required on an integrated circuit are minimized.

18 Claims, 5 Drawing Sheets

APPARATUS FOR CONTROLLING THE IMPEDANCE OF HIGH SPEED SIGNALS ON A PRINTED CIRCUIT BOARD

BACKGROUND OF THE INVENTION

1. Field of the Invention

The present invention relates to the placement of line traces on printed circuit substrates such that the number of power pins for an integrated circuit can be minimized and/or the impedance of the traces is controlled to thereby provide an environment for high speed signal transmission.

2. Description of the Related Art

The level change rate of a digital signal is commonly called the speed or the frequency of the signal. In digital circuits, a signal path constitutes several physical segments, e.g., the bond wire within an integrated circuit "IC", the IC pin, the printed circuit board "PCB" traces between vias, the via themselves, the connector pins, the PCB edge connector finger, etc. Each of these line segments has associated parasitics such as resistance, inductance and capacitance. The impedance of a line is a function of these parasitics. When there is an impedance mismatch between two of these segments, a discontinuity occurs and a signal reflection will occur at the discontinuity. Depending on the nature of the impedance mismatch, the reflected signal phase and amplitude will be "added" or "subtracted" from the original signal. The result affects the shape of the original signal at different locations of the signal path. The reflection can travel back-and-forth several times between two mismatched points on the line until the total reflected signal amplitude is diminished by the reflective signal amplitude cancellation and the resistive loss in the trace.

In short, an impedance mismatch can detrimentally effect the shape of a signal traveling on a line (risingedge, fallingedge, and steady state) enough to cause a misinterpretation of the signal by the receiving electronics. The higher the signal speed the more critical impedance matching becomes.

A PCB or a connector is said to be impedance controlled when the characteristic impedance ($Z_o$) of its signal traces are designed to all have an impedance within a predefined tolerance. Ideally, a manufacturer would like to design traces on a PCB at a minimal cost without sacrificing necessary performance.

In a multi layer PCB (where there are more than two (2) conductive, etched layers), power planes are usually implemented to separate "signal planes". This design enables the characteristic impedance ($Z_o$) of the traces on the signal planes to be controlled with relative ease. The impedance control is related to placing the power or ground planes a predetermined distance from the signal planes thereby establishing a relatively constant capacitance. Furthermore, for a given multi layer PCB having a dielectric constant, metal signal traces (typically copper), and a given board thickness, the characteristic impedance ($Z_o$) of a trace is directly proportional to the distance (h) a trace is from a power/ground plane, and it is inversely proportional to the width (w) of a trace in accordance with the relationships:

$$Z_o \propto (h, 1/w)$$

On the other hand, if the PCB is a two layer board (having only two (2) etched, conductive layers), then controlling the characteristic impedance ($Z_o$) becomes difficult. On a two layer board the characteristic impedance ($Z_o$) of a trace is directly proportional to the distance (h) and spacing (s) of the trace to a power or ground on the other side of the two layer PCB, it is inversely proportional to the width (w) of a trace. This calculation becomes very complex as traces are opposite to and are crisscrossed by power, ground and signal traces on the other side of the two (2) layer board. In general the most simple relationship is:

$$Z_o \propto (h, s, 1/w)$$

In the semiconductor industry, technology is pushing electronics to become smaller and smaller in size. More, and more circuitry is being placed into a single integrated circuit. Sometimes circuits are split onto two separate pieces of silicon that must be interconnected when installed on a PCB. The communication between the two circuits is generally at a very high rate of speed (in the hundreds to thousands of megahertz range) and the characteristic impedance ($Z_o$) of the traces between the circuits becomes very important so that signal reflections do not inhibit transmission.

On two layer PCB boards, large power planes are not normally incorporated because the board thickness is generally too thick for a power plane to be effective and because the power planes use up too much space on the PCB. Instead, a technique of interleaving might be used. FIG. 1 depicts a common technique used to provide some control over the characteristic impedance of traces on a two layer PCB. Generally, power or ground traces are interleaved with the signal traces on a single side of the PCB and only control a degree of crosstalk.

The problem when controlling the impedance of signal traces is providing enough power or ground traces from an integrated circuit or other source to interleave between a plurality of high speed signal lines.

In summary, there is a need for a low cost technique for controlling the characteristic impedance ($Z_o$) of signal traces on a two layer PCB. Furthermore, there is a need for a technique to control the characteristic impedance ($Z_o$) of line traces without requiring a large number of power or ground pins on integrated circuits to provide power or ground traces to interleave between signal traces.

SUMMARY OF THE INVENTION

The present invention relates to an apparatus and method for minimizing the number of integrated circuit power/ground pins required on a two-sided printed circuit board when implementing impedance controlled signal traces for signals in hundreds to thousands of Megahertz.

The present invention relates to a circuit on a two sided printed circuit board. Signal traces extend from an integrated circuit on both sides of the two-sided circuit board. Power or ground traces are interleaved between the signal traces on one side of the printed circuit board and are opposite signal traces on the other side of the printed circuit board. The power or ground traces are fanned out on at least one side of the printed circuit board so that a ground or power trace is interposed between the signal traces.

Such a configuration of power, ground and signal traces minimizes the number of power or ground pins required on an integrated circuit to control the impedance of the high speed signal traces.

BRIEF DESCRIPTION OF THE DRAWINGS

Other objects, features, and characteristics of the present invention as well as methods of operation and functions of the related elements of structure, and the combination of parts and economies of manufacture, will become more apparent upon consideration of the following description and the appended claims with reference to the accompanying drawings, all of which form a part of this specification, and wherein:

DETAILED DESCRIPTION OF THE PREFERRED EXEMPLARY EMBODIMENTS OF THE PRESENT INVENTION

The exemplary present invention relates to an apparatus and method of sending high speed digital signals (in the 100's to 1,000's of megahertz) over traces on a printed circuit board (PCB) in such a manner that the characteristic impedance, $Z_0$, of the traces is controlled. Furthermore, the present invention relates to sending high speed digital signals over traces on a PCB so that crosstalk between signal traces is minimized. The exemplary present invention also depicts a method and apparatus which minimizes the number of integrated circuit (IC) power or ground pins required to implement impedance controlled signal traces on a two-layer PCB.

Figure 1:
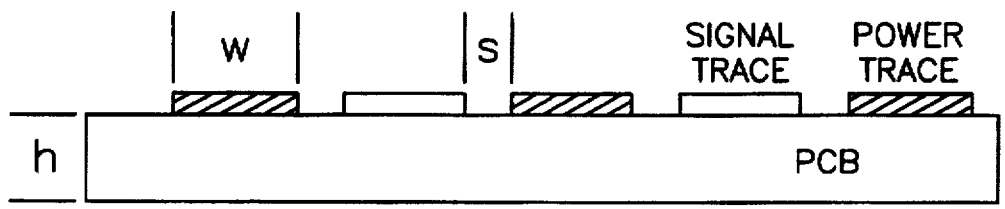
FIG. 1 depicts a prior art technique for controlling the characteristic impedance of a PCB trace.
Figure 2A:
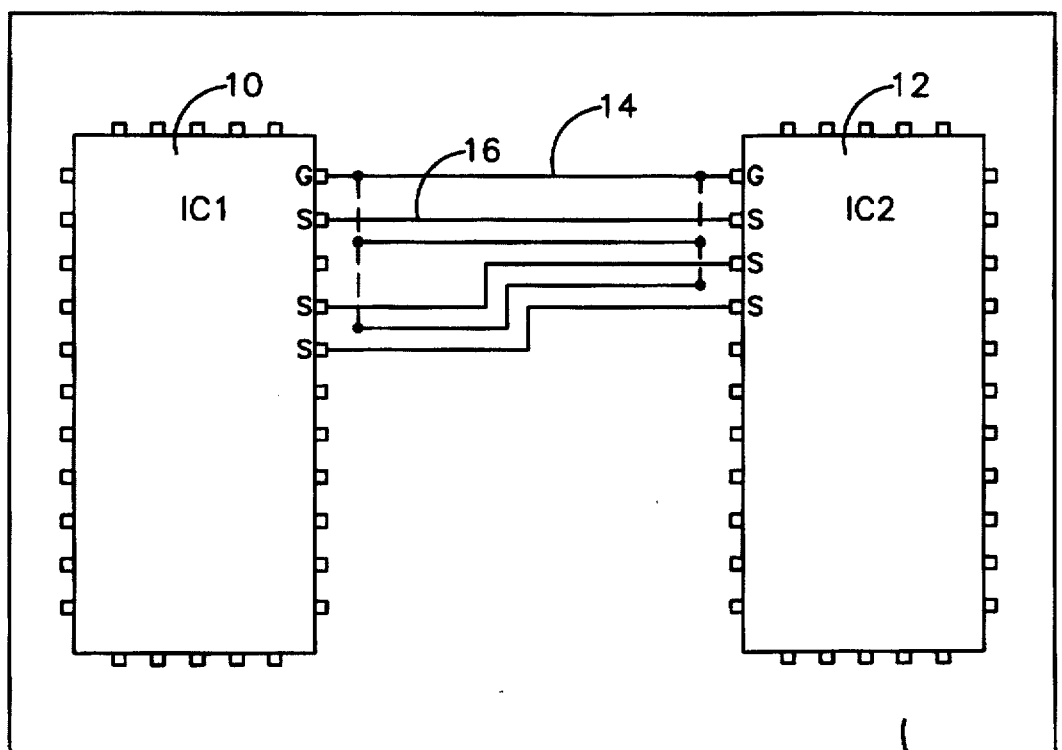
FIGS. 2a and 2b depict an exemplary technique and apparatus for controlling the characteristic impedance of a PCB trace.

The exemplary present invention, further provides an efficient and low-cost implementation of controlling impedance on two-layer PCB's and related connectors in situations wherein the application-integrated circuits are connected between two point-to-point devices (rather than being bussed among more than two devices). FIG. 2a depicts an example of traces connecting two point-to-point devices. Here, a high speed circuit is separated into two integrated circuits, IC1 10 and IC2 12. The traces 14 are shown by a solid line when the trace is on the top side of the PCB 18 and by a dotted line when on the back side of the PCB. The present invention is ideally suited for circuitry found on two-sided circuit cards in computer systems.

Various components require interconnection in a point-to-point scheme. For example, suppose a circuit designer required a high signal toggle rate of up to approximately 200 MHZ, on approximately 12 signal traces, and wanted to provide a limited number of power and ground pins on each IC. When designing the point-to-point interconnection, the designer also would want the interconnect scheme to provide a minimum amount of crosstalk between signal traces and the impedance of the transmission lines should be controlled so that signal refections are minimized.

Figure 2B:
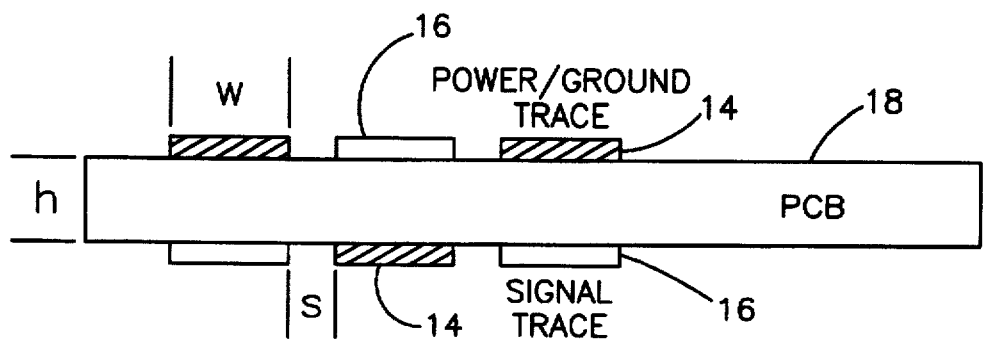

FIG. 2b depicts an exemplary embodiment of the present invention wherein signal and power traces are interleaved on opposite sides of a PCB 18. The embodiment controls impedance and crosstalk between the signal traces 16. Power/ground traces 14 are interleaved between signal traces 16 on one side of a PCB 18. The signal traces 16 are directly opposite to power/ground traces 14 that are on the other side of the PCB 18.

Various experiments were conducted to simulate interleaved signal traces on a two sided PCB. Referring to Table-1, below, and FIG. 2b, the results of the experiment are shown. The characteristic impedance, $Z_0$, of a signal trace 16 is determined with respect to the trace width (w), the trace spacing (s). For a given two-layer PCB dielectric and trace materials, the $Z_0$ of a trace is directly proportional to the height (h) of a PCB and the spacing (s) and is indirectly proportional to the width (w) of a trace as shown in Table-2.

TABLE 1

Simulation results to demonstrate that $Z_0$ is directly proportional to the trace spacing (s) and the PCB height (h), for a constant trace width (w).
width (w) = 5 mils

| | $Z_0$ (ohms) | | | |
|---|---|---|---|---|
| s (mils) | h = 49.8 mils | h = 57.8 mils | h = 65.8 mils | s/w |
| 1 | 35.78 | 35.80 | 35.81 | 0.2 |
| 2 | 51.01 | 51.23 | 51.27 | 0.4 |
| 3 | 61.72 | 61.80 | 62.08 | 0.6 |
| 4 | 70.11 | 70.23 | 70.57 | 0.8 |
| 5 | 77.05 | 77.20 | 77.32 | 1.0 |
| 6 | 82.99 | 83.18 | 83.32 | 1.2 |
| 7 | 88.18 | 88.41 | 88.58 | 1.4 |
| 8 | 92.80 | 93.07 | 93.27 | 1.6 |
| 9 | 96.95 | 97.26 | 97.49 | 1.8 |
| 10 | 101.42 | 101.78 | 102.05 | 2.0 |

TABLE 2

Simulation results to demonstrate that $Z_0$ is inversely proportional to the trace width (w) for a constant PCB height (h) and a constant trace spacing (s).

| | $Z_0$ (ohms) | |
|---|---|---|
| w (mils) | h = 54 mils, s = 5 mils | h = 70 mils, s = 5 mils |
| 5 | 77.03 | 77.32 |
| 6 | 73.74 | 74.21 |
| 7 | 71.44 | 71.72 |
| 8 | 68.93 | 69.23 |

The experiment confirmed that the present invention is capable of achieving a wide range of impedances. Furthermore, the PCB thickness (h) does not have a significant impact on the $Z_0$ of a signal trace. Using the present invention and method a desired signal trace impedance can be achieved on a two-layer PCB 18 by varying the trace width (w) and the spacings (s) between adjacent traces as follows:

$$Z_0 \alpha (s, 1/w)$$

where the thickness (h) of the PCB material remains constant.

The present invention also minimizes the number of power and ground pins required on an integrated circuit, minimizes the PCB area required for the traces, and maintains a minimization of crosstalk between signal traces while having a controlled impedance.

Figure 3:
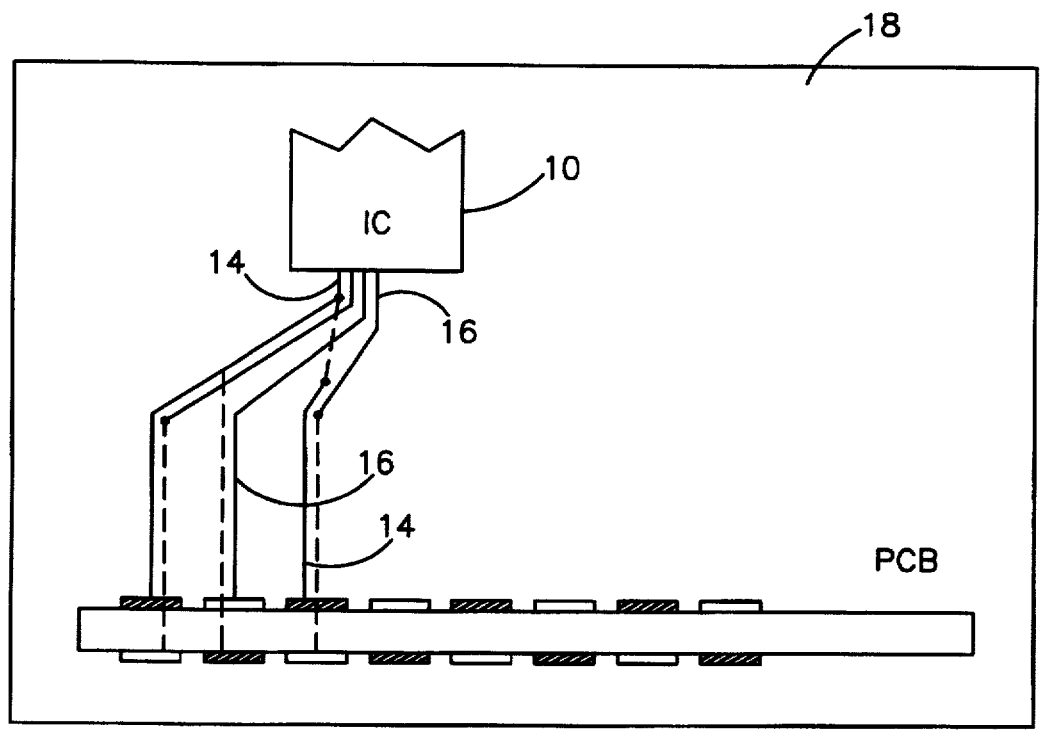
FIGS. 3.3a and 3b depict an exemplary apparatus and technique for controlling and testing the characteristic impedance of a PCB trace and for minimizing the number of power pins required on an integrated circuit.

FIG. 3 depicts an exemplary method and embodiment of interleaving signal 16 and power/ground traces 14 with a minimum number of power/ground pins available on the integrated circuit 10. The technique is to fan out the power/ground pin traces so that interleaving of the signal traces and power/ground traces results in a 1:1 ratio. The dotted traces in FIG. 3 depict traces on the bottom side of the PCB 18 and the solid traces indicate traces on the top side of the PCB 18.

The dotted traces on the bottom side of the PCB 18 are directly below and opposite the traces on the top side of the PCB 18. When the traces are interleaved as signal, power/ground, signal, power/ground on each side of the PCB such that a signal trace is always substantially opposite to a power/ground trace, the impedance of the signal traces 16 are controlled and the crosstalk between the signal traces 16 is minimized.

This method and apparatus can be used in situations where the traces provide IC-to-IC or IC-to-connector interconnect. The power/ground traces 14 are fanned out near the IC 10 or near each IC. The fanning out of the power/ground traces 14 minimizes the number of power/ground pins required on an IC 10.

The present invention has been simulated on a HSPICE computer simulation program and an actual lab testing of a prototype has been done, which interleaved signal trace and power/ground traces in accordance with the present invention. Both the HSPICE simulation and the lab prototype produced similar results. Both the simulation and the actual lab testing indicated that the characteristic impedance, $Z_0$, of the signal traces could be controlled and tailored to a specific predetermined characteristic impedance, $Z_0$, via the present inventive method and apparatus.

Figure 3A:
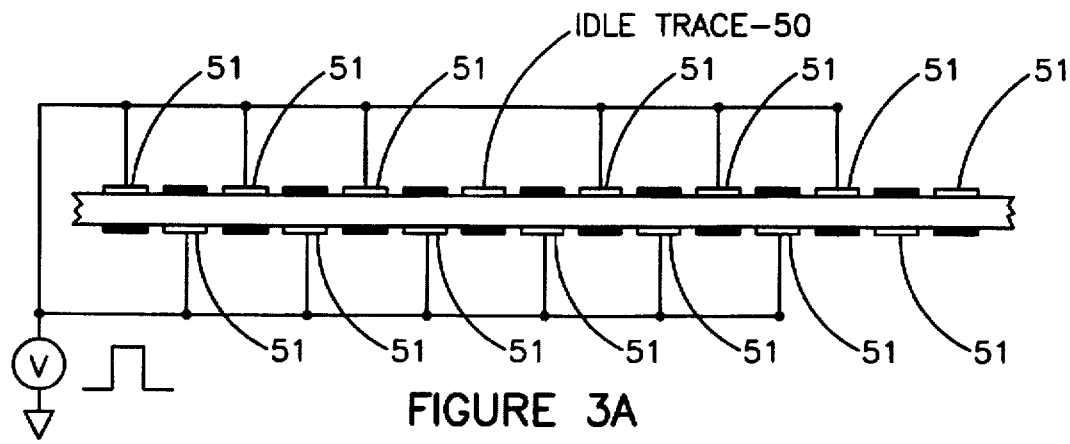
Figure 3B:
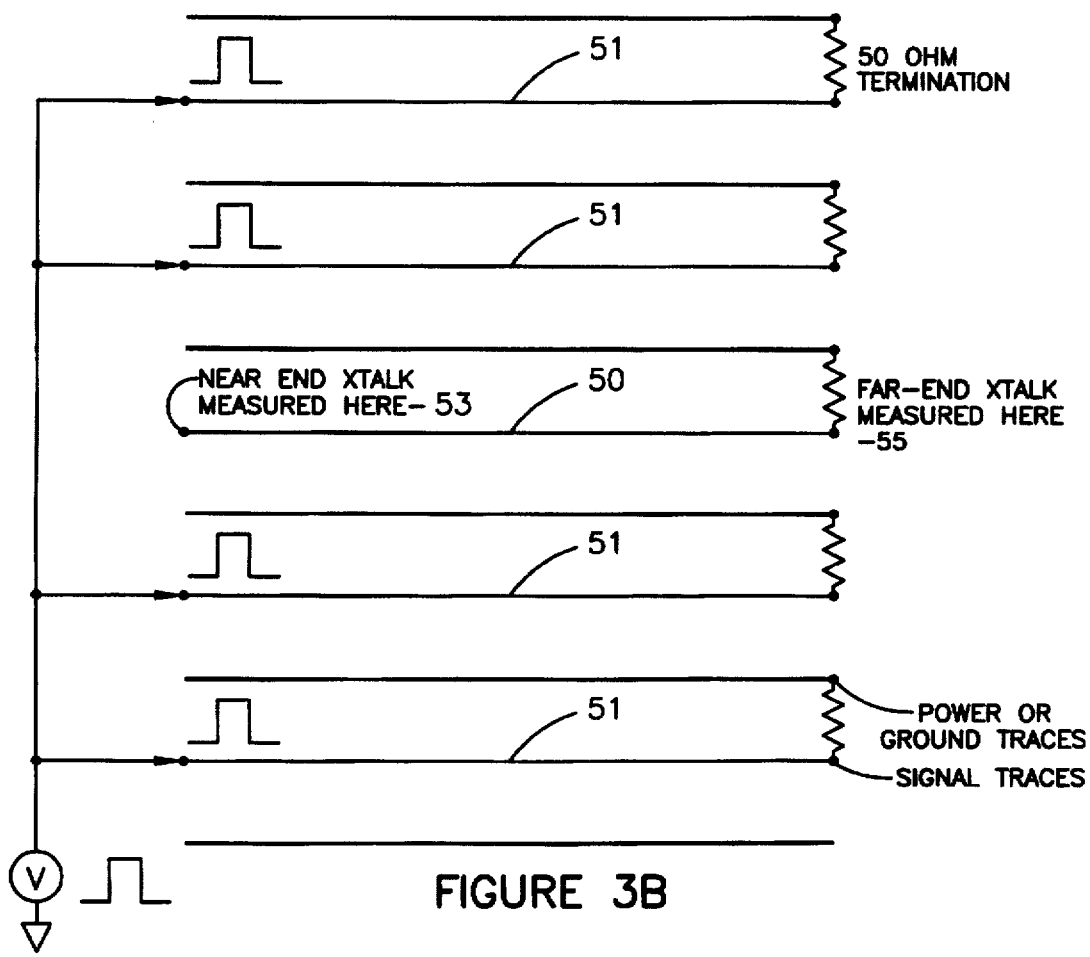

Furthermore, the present exemplary method and apparatus was tested for resistance to crosstalk. In the test, a 1 volt pulse with a 1 nsec edge rise-time rate was introduced simultaneously at one end of eleven (11) signal traces, all of which are surrounded by power and ground traces in accordance with the present invention. At the same end, a twelfth trace was left unconnected, i.e. let "idle". The idle trace 50 was purposely selected to be in the middle area of the other eleven signal traces 51, as shown in FIG. 3a. The crosstalk voltages which coupled onto the idle signal trace 50 were measured at both the near end 53 and the far end 55 of idle trace 50, as shown in FIG. 3b.

The test results indicated negligible cross talk to the idle trace. That is, the largest crosstalk signals had an amplitude of +/−41.25 mV peak (<5%) and were less than 1.64 nsec in duration at the near end. And, at the far end, the largest crosstalk pulses were measured to be +/−16 mV peak (<2%) and 920 psec wide. The majority of the crosstalk pulses were less than 4 mV in amplitude.

Figure 4A:
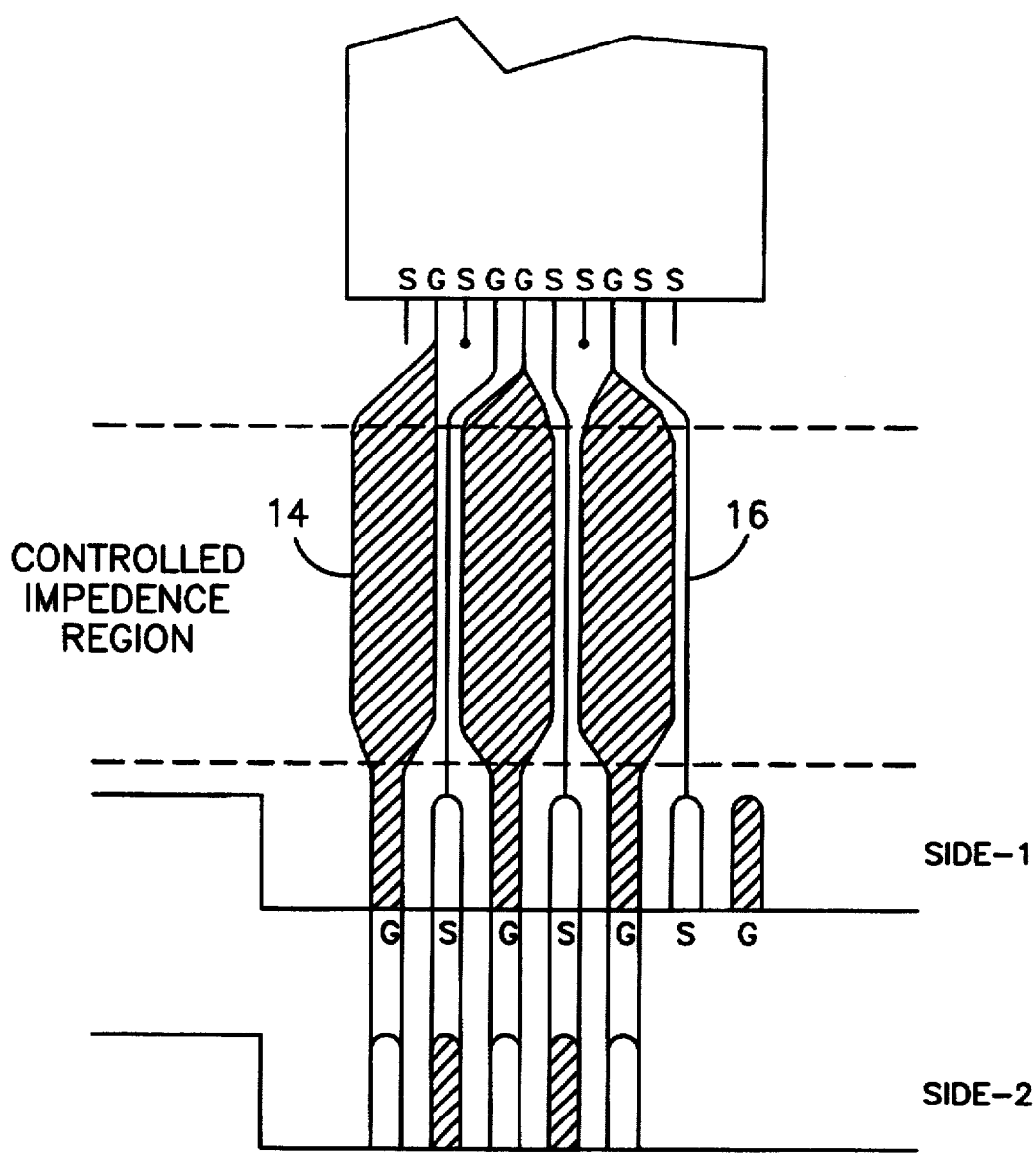
FIGS. 4a and 4b depict a second embodiment of the present invention and technique for controlling the characteristic impedance of a PCB trace and for minimizing the number of power pins required on an integrated circuit.
Figure 4B:
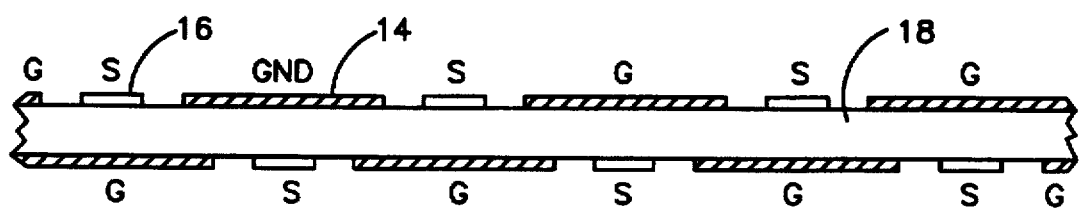

FIGS. 4a and 4b depict another exemplary embodiment of the present invention. FIGS. 4a and 4b show the power/ground lines having a wider trace width than the signal traces 18. It was determined in testing that this configuration works well, but is not necessary. This technique can be used if PCB space 18 is available. Of course one of ordinary skill in the art would understand that the power/ground traces 14 could be fanned out as depicted in FIG. 3.

Figure 5:
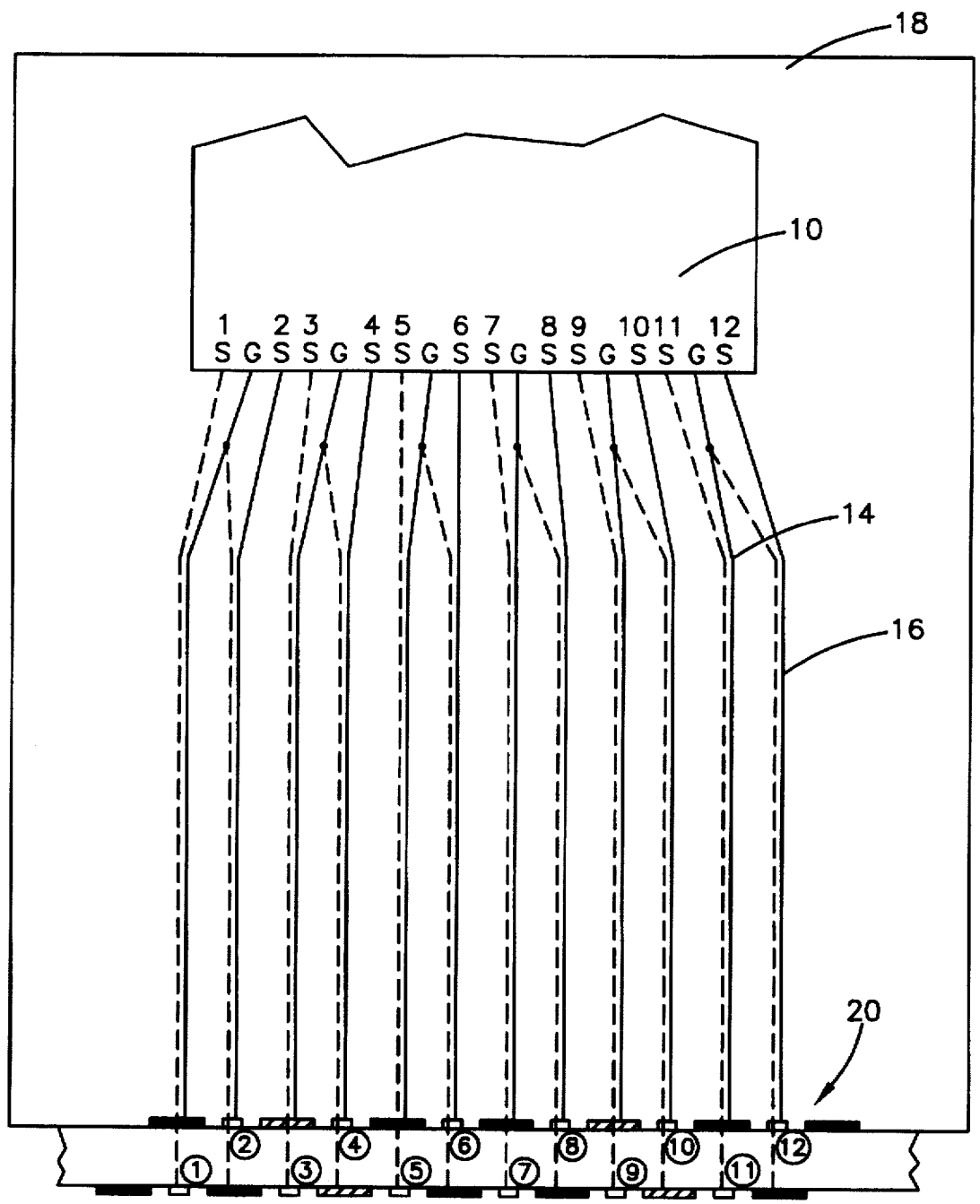
FIG. 5 depicts another exemplary embodiment of the present invention and technique of for sending high speed signals through traces on a two sided PCB.

FIG. 5 depicts another exemplary embodiment of the present invention wherein the signal pins to power/ground pins on an integrated circuit have a 2:1 ratio and a 1:1 ratio on a connector. The dashed traces indicate traces on the back side of the PCB 18 and the solid traces indicated traces on the front side of the board. The fanout and interleaved techniques of the present invention are incorporated to provide consistence signal impedance on the lines, and signal trace isolation to minimize crosstalk.

Although a few preferred embodiments of the invention have been shown and described, it will be appreciated by those skilled in the art that changes may be made in these embodiments without departing from the principles and the spirit of the invention, the scope of which is defined in the appended claims.

What is claimed is:

1. A computer system comprising a printed circuit board, said printed circuit board comprising:

a substrate having a front side and a back side;

a plurality of signal traces on both said front side and said back side of said substrate; and a ground/power trace formed on said front side and said back side of said substrate in a fanned out manner from a ground/power pin location point on said printed circuit board such that said ground/power trace is interleaved with said plurality of said signal traces.

2. A printed circuit board comprising:

a dielectric board having a front side and a back side;

a plurality of signal traces formed on said front side and said back side of said dielectric board; and a ground/power trace interleaved between said plurality of signal traces on said front side and said back side of said dielectric board such that a substantial portion of each one of said plurality of said signal traces is substantially parallel and adjacent to said ground/power trace, said interleaved ground/power trace originating from a ground/power node of an integrated circuit location.

3. The printed circuit board of claim 2, wherein an impedance of each one of said plurality of signal traces is set at a predetermined impedance.

4. A printed circuit board comprising:

a substrate board having a front side and a back side;

a first signal trace on said front side of said substrate board;

a ground/power trace originating from a location and fanned-out such that said ground/power trace is placed substantially alongside and spaced from both sides of said first signal trace on said front side of said substrate board and substantially adjacent to said signal trace on said backside of said substrate board such that an impedance of said signal trace is substantially constant, said location is a ground/power pin location of an integrated circuit.

5. The printed circuit board of claim 4, further comprising a second signal trace positioned substantially parallel and adjacent to said ground/power trace on said back side of said substrate board.

6. A computer comprising a printed circuit board, said printed circuit board comprising:

a substrate board having a front side and a back side;

a first signal trace on said front side of said substrate board;

a ground/power trace originating from a location and fanned-out such that said ground/power trace is placed substantially alongside and spaced from both sides of said first signal trace on said front side of said substrate board and substantially adjacent to said signal trace on said backside of said substrate board such that an impedance of said signal trace is substantially constant, said location is a ground/power pin location of an integrated circuit.

7. A double sided printed circuit board comprising:

a first signal trace on a first side of said printed circuit board beginning at a first location and terminating at a second location, said first location is a first signal pin of a first integrated circuit;

a trace having a relatively constant potential, said trace being on, at least, one side of said first signal trace and on said first side of said printed circuit board, said trace further being on a second side of said printed circuit board such that said trace is opposite said signal trace, said trace and said first signal trace together providing a relatively uniform impedance on said signal trace.

8. The double sided printed circuit board of claim 7, wherein said second location is a first signal pin of a second integrated circuit.

9. A circuit on a printed circuit board having a top side and a bottom side, comprising:
   a first integrated circuit having N signal pins and M ground/power pin(s) wherein N is greater or equal to M,
   N signal traces, positioned in a parallel fashion on a first side and second side of a printed circuit board, connected, one each, to said N signal pins;
   M ground/power trace(s) connected, one each, to said M ground/power pin(s), said M ground/power trace(s) being fanned out such that said M ground/power trace(s) are interleaved between said N signal traces such that each one of said N signal traces has at least one of said M ground/power traces on each side and each one of said N signal traces has one of said M ground/power trace parallel to and directly on the opposite side of said printed circuit board with respect to each one of said N signal traces.

10. The circuit of claim 9, wherein said N signal traces have a predetermined impedance.

11. The circuit of claim 9, wherein crosstalk between said N signal traces is minimized.

12. The circuit of claim 9, wherein said N signal traces are connected to a second integrated circuit having N signal pins.

13. A computer comprising a circuit on a printed circuit board having a top side and a bottom side, said circuit on said printed circuit board comprising:
   a first integrated circuit having N signal pins and M ground/power pin (s) wherein N is greater or equal to M,
   N signal traces, positioned in a parallel fashion on a first side and second side of a printed circuit board, connected, one each, to said N signal pins;
   M ground/power trace(s) connected, one each, to said M ground/power pin(s), said M ground/power trace(s) being fanned out such that said M ground/power trace(s) are interleaved between said N signal traces such that each one of said N signal traces has at least one of said M ground/power traces on each side and each one of said N signal traces has one of said M ground/power trace parallel to and directly on the opposite side of said printed circuit board with respect to each one of said N signal traces.

14. A circuit on a printed circuit board wherein said printed circuit board has a first side and a second side, comprising:
   a first set of substantially parallel signal traces on said first side of said printed circuit board;
   a second set of substantially parallel signal traces on said second side of said printed circuit board, said second set of said substantially parallel signal traces being substantially parallel to and staggered between said first set of substantially parallel signal traces;
   at least one ground/power trace being fanned out from a ground/power pin location of an integrated circuit on at least one of said first side and said second side of said printed circuit board such that said at least one said ground/power trace is interposed between said first set and said second set of substantially parallel signal traces.

15. The circuit of claim 14, wherein said first set and said second set of substantially parallel signal traces are connected to at least one integrated circuit.

16. The circuit of claim 14, wherein said at least one ground/power trace is connected to a ground/power pin of an integrated circuit.

17. The circuit of claim 14, wherein said first set and said second set of substantially parallel signal traces are adapted to have a predetermined impedance and contribute to a minimum amount of crosstalk.

18. The circuit of claim 14, wherein said circuit is incorporated into a computer.

* * * * *